United States Patent
Golgiri et al.

(10) Patent No.: US 11,270,534 B2
(45) Date of Patent: Mar. 8, 2022

(54) SYSTEMS AND METHODS TO COMPENSATE FOR WIRELESS SIGNAL ATTENUATION IN A PASSIVE KEY HANDS-FREE VEHICLE-RELATED APPLICATION

(71) Applicant: Ford Global Technologies, LLC, Dearborn, MI (US)

(72) Inventors: Hamid M. Golgiri, Livonia, MI (US); Thomas Joseph Hermann, Troy, MI (US); John Robert Van Wiemeersch, Novi, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 16/926,562

(22) Filed: Jul. 10, 2020

(65) Prior Publication Data
US 2022/0012962 A1    Jan. 13, 2022

(51) Int. Cl.
*G07C 9/00* (2020.01)
*H03F 3/19* (2006.01)
*G06F 3/01* (2006.01)
*H04B 17/327* (2015.01)

(52) U.S. Cl.
CPC ......... *G07C 9/00309* (2013.01); *G06F 3/017* (2013.01); *H03F 3/19* (2013.01); *H04B 17/327* (2015.01); *G07C 2009/00357* (2013.01)

(58) Field of Classification Search
None
See application file for complete search history.

(56) References Cited

U.S. PATENT DOCUMENTS

| 8,976,965 | B2 * | 3/2015 | Aminzade ............. H04L 63/107 380/258 |
| 10,212,545 | B2 | 2/2019 | Choi et al. |
| 10,328,898 | B2 | 6/2019 | Golsch et al. |
| 2018/0234797 | A1 * | 8/2018 | Ledvina ................ H04W 4/023 |

OTHER PUBLICATIONS

Amr Alanwar et al., "Selecon: Scalable IoT Device Selection and Control Using Hand Gestures", IoTDI, Pittsburgh, PA, Apr. 2017, 12 pages.

* cited by examiner

*Primary Examiner* — Adolf Dsouza
(74) *Attorney, Agent, or Firm* — Frank Lollo; Eversheds Sutherland (US) LLP

(57) ABSTRACT

In some cases, signal attenuation may occur when a mobile device communicates with a vehicle. To accommodate for this, a vehicle may determine a distance between the vehicle and the mobile device by evaluating a signal strength of a wireless signal received from the mobile device. An erroneous distance result may be produced when the wireless signal is attenuated by an intervening object. A wearable device worn by the individual is used to detect the presence of the mobile device. The detection procedure involves measuring a separation distance between the wearable device and the mobile device at different instances in time as the individual swings his/her arm back and forth while moving towards the vehicle.

20 Claims, 12 Drawing Sheets

SYSTEMS AND METHODS TO COMPENSATE FOR WIRELESS SIGNAL ATTENUATION IN A PASSIVE KEY HANDS-FREE VEHICLE-RELATED APPLICATION

FIELD

This disclosure generally relates to operations associated with a vehicle and more particularly relates to using a personal communication device for executing passive key hands-free operations upon a vehicle.

BACKGROUND

The use of smartphones and other mobile devices has become so ubiquitous that it is advantageous to consolidate various functions and features into them, particularly if the consolidation offers an opportunity to discard several other devices. For example, various functions that were traditionally carried out by a wireless key fob for performing certain operations upon a vehicle can now be consolidated into a single mobile device, such as a smartphone or the like.

For example, traditional wireless key fobs can be used for performing operations, such as locking the doors of the vehicle, unlocking the doors of the vehicle, and starting the engine of the vehicle. The functionality of the wireless key fob can be incorporated/consolidated into a smartphone, which may be referred to as a Phone-as-a-Key (PaaK) device. In this manner, the PaaK device can be configured to perform operations that have been traditionally carried out using a key fob or a conventional hard/physical key.

One example function that can be carried out by a PaaK device is a proximity sensing feature that allows a computer in a vehicle to carry out certain actions automatically upon sensing the presence of a PaaK device close to the vehicle. For example, the computer can automatically unlock a door of the vehicle when the PaaK device is close to the vehicle. The person carrying the PaaK device does not have to perform any action for opening the door, such as depressing a key on a key fob or inserting a conventional hard key into a door lock. The computer in the vehicle senses the proximity of the PaaK device to the vehicle by using a wireless signal to communicate with the PaaK device and executes a distance measuring procedure. This process of hand-free entry into the vehicle may be referred to as Passive Entry. Similarly, the process of starting the vehicle ignition by proximity to the cabin interior without handling the key may be referred to as Passive Start. In some cases, the accuracy of the distance measuring procedure may be compromised as a result of various factors, such as, for example, loss of signal, signal attenuation, signal reflection, and signal interference. It is therefore desirable to address at least some of these factors and improve the accuracy of traditional distance measuring procedures performed by a device used for passive key hands-free vehicle-related operations.

BRIEF DESCRIPTION OF THE DRAWINGS

A detailed description is set forth below with reference to the accompanying drawings. The use of the same reference numerals may indicate similar or identical items. Various embodiments may utilize elements and/or components other than those illustrated in the drawings, and some elements and/or components may not be present in various embodiments. Elements and/or components in the figures are not necessarily drawn to scale. Throughout this disclosure, depending on the context, singular and plural terminology may be used interchangeably.

DETAILED DESCRIPTION

Overview

Figure 1:
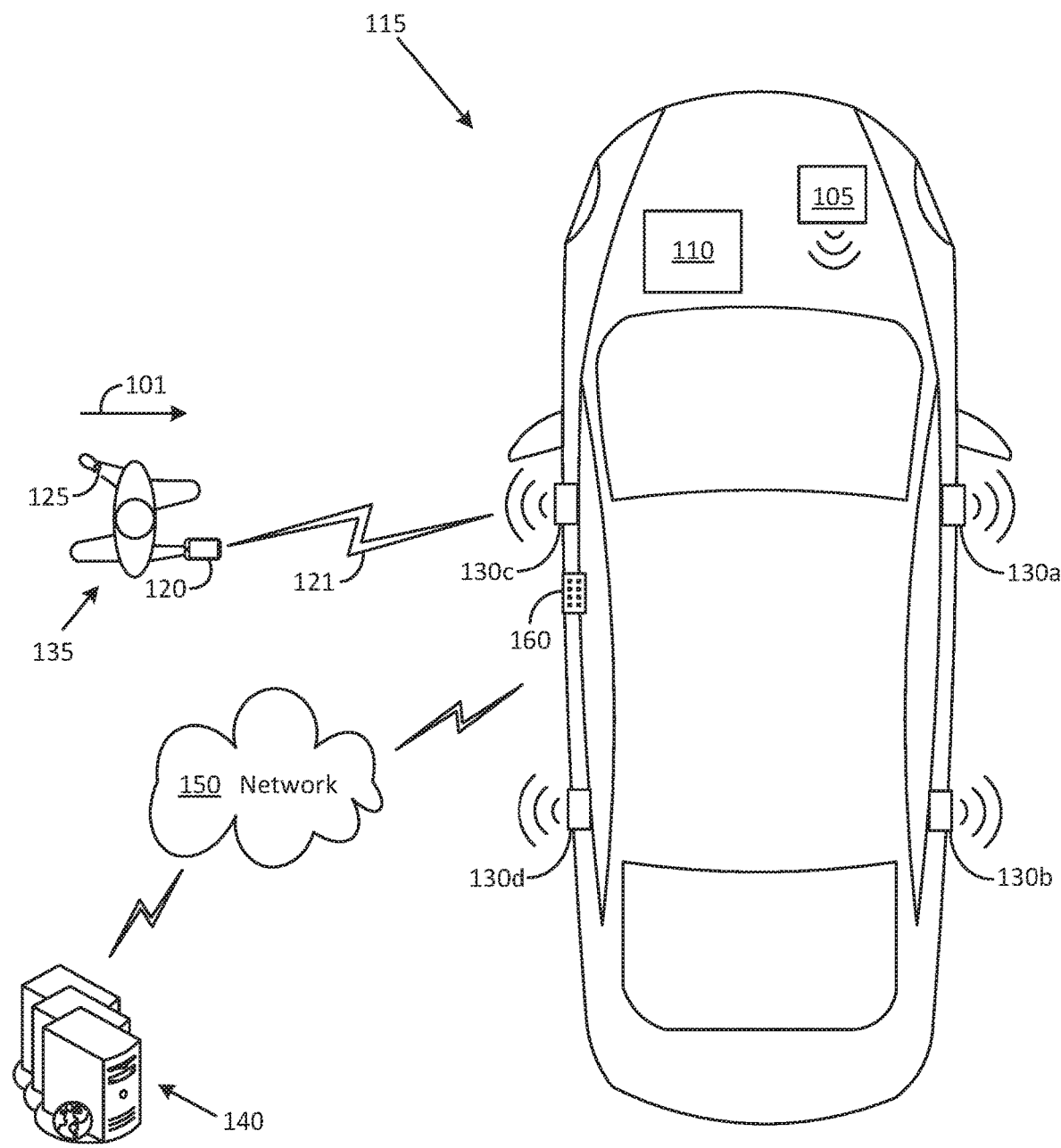
FIG. 1 illustrates a first example scenario where an individual is moving towards a vehicle that supports passive key hands-free operations in accordance with an embodiment of the disclosure.

In terms of a general overview, certain embodiments described in this disclosure are directed to systems and methods to compensate for wireless signal attenuation when a vehicle is executing a wireless procedure to determine a location of a personal communication device that supports passive key hands-free operations. The personal communication device can be any of various types of personal communication devices configured to perform passive key hands-free operations, such as, for example, a smartphone, a tablet computer, a phablet (phone plus tablet computer), or a portable computer. The personal communication device may be any suitable mobile or nomadic device. In an example method in accordance with the disclosure, a vehicle determines a separation distance between the vehicle and the personal communication device by evaluating a signal strength of a wireless signal received from the personal communication device. The signal strength evaluation may lead to an erroneous separation distance result when the wireless signal is attenuated by an intervening object or body (a pet, for example) between the personal communication device and the vehicle. In one example scenario, the intervening object may be a body part of an individual carrying the personal communication device in his/her back pocket when moving towards the vehicle. A wearable device of the individual may be used to detect the presence of the personal communication device in the back pocket of the individual. The detection procedure may involve measuring a separation distance between the wearable device and the personal communication device at different instances in time as the individual swings his/her arm back-and-forth when walking towards the vehicle. A compensating factor may be applied to the measurement result of the signal strength evaluation procedure if the personal communication device is being carried in the back pocket of the individual.

Illustrative Embodiments

The disclosure will be described more fully hereinafter with reference to the accompanying drawings, in which example embodiments of the disclosure are shown. This disclosure may, however, be embodied in many different forms and should not be construed as limited to the example embodiments set forth herein. It will be apparent to persons skilled in the relevant art that various changes in form and detail can be made to various embodiments without departing from the spirit and scope of the present disclosure. Thus, the breadth and scope of the present disclosure should not be limited by any of the above-described example embodiments but should be defined only in accordance with the following claims and their equivalents. The description below has been presented for the purposes of illustration and is not intended to be exhaustive or to be limited to the precise form disclosed. It should be understood that alternate implementations may be used in any combination desired to form additional hybrid implementations of the present disclosure. For example, any of the functionality described with respect to a particular device or component may be performed by another device or component. Furthermore, while specific device characteristics have been described, embodiments of the disclosure may relate to numerous other device characteristics. Further, although embodiments have been described in language specific to structural features and/or methodological acts, it is to be understood that the disclosure is not necessarily limited to the specific features or acts described. Rather, the specific features and acts are disclosed as illustrative forms of implementing the embodiments.

Certain words and phrases are used herein solely for convenience and such words and terms should be interpreted as referring to various objects and actions that are generally understood in various forms and equivalencies by persons of ordinary skill in the art. For example, the word "vehicle" as used in this disclosure can pertain to any one of various types of vehicles, such as cars, vans, sports utility vehicles, trucks, electric vehicles, gasoline vehicles, hybrid vehicles, and autonomous vehicles. The phrase "personal communication device" as used herein refers to any of various types of personal communication devices configured to perform "passive key hands-free" function, such as, for example, a "Phone-as-a-Key" (PaaK) function. Furthermore, the phrase "passive key hands-free" as used in this disclosure generally refers to various operations that may be performed upon and/or in a vehicle without inserting a key into an ignition lock of the vehicle. A few examples of a personal communication device can include a cellular phone, a smartphone, a tablet computer, a phablet (phone plus tablet computer), and a portable computer. Such personal communication devices may be used for executing various operations, including PaaK operations, such as accessing and operating a vehicle without the need for a physical key fob, controlling certain components of a vehicle from outside the vehicle, and performing vehicle operations remotely (including start engine, lock, and unlock). A personal communication device configured for PaaK operations can also be used for conducting actions, such as lifting up windows, lowering windows, operating a liftgate, emitting a panic signal, fuel consumption, and verifying tire pressure. A valet mode of operation allows providing of a temporary passcode to a valet attendant for enabling the valet to enter and drive the vehicle.

The phrase "wearable device" as used herein refers to any kind of device that includes a computing element, such as a processor, and can be worn by an individual. A few examples of a wearable device can include a smartwatch (such as, for example, an Apple® smartwatch or a Samsung® smartwatch) and a fitness/activity tracking device (such as, for example, Fitbit®, Samsung® Gear Fit®, and Garmin® activity tracker).

FIG. 1 illustrates a first example scenario where an individual 135 is moving towards a vehicle 115 that supports passive key hands-free operations in accordance with an embodiment of the disclosure. The vehicle 115 may include various components, such as, for example, a vehicle computer 110, a passive key hands-free management system 105, and a wireless communication system. The vehicle computer 110 may perform various functions, such as controlling engine operations (fuel injection, speed control, emissions control, braking, etc.), managing climate controls (air conditioning, heating etc.), activating airbags, and issuing warnings (check engine light, bulb failure, low tire pressure, vehicle in blind spot, etc.). In some cases, the vehicle computer 110 may include more than one computer, such as, for example, a first computer that controls engine operations and a second computer that performs actions such as managing an anti-theft system and/or an infotainment system provided in the vehicle 115.

The passive key hands-free management system 105 can be an independent unit in some implementations and may be incorporated into the vehicle computer 110 in some other implementations. When incorporated into the vehicle computer 110, some components (such as, for example, a processor) may be configured to execute operations related to the vehicle computer 105 as well as operations related to the passive key hands-free management system 105. In yet some other implementations, the vehicle computer 110 of a conventional vehicle may be modified to perform operations associated with the passive key hands-free management system 105. The modifications can include, for example, additional software and/or firmware that are executable by the processor to perform operations associated with the passive key hands-free management system 105.

In terms of functional aspects, the passive key hands-free management system 105 may be configured to control various operations, such as authenticating a personal communication device 120 configured as a passive key hands-free device, unlocking of the doors of the vehicle 115, locking the doors of the vehicle 115, and unlatching a door of the vehicle 115. In an example implementation, the personal communication device 120 can be a smartphone configured to run a PaaK software application. The PaaK software application allows the personal communication device 120 to be used for performing various operations, such as locking or unlocking a door of the vehicle 115 and/or for starting the engine of the vehicle 115. In at least some cases, the personal communication device 120 may eliminate the need to use a factory key fob, which can prove particularly useful in certain situations, such as when the factory key fob is lost or has been misplaced by accident.

The personal communication device 120 may use one or more of various wireless technologies, such as Bluetooth®, Ultra-Wideband (UWB), Wi-Fi, ZigBee®, or near-field-communications (NFC), for carrying out wireless communications with certain components of the vehicle 115. In an example embodiment, a set of wireless communication nodes 130a, 130b, 130c, and 130d may be provided on the body of the vehicle 115. In an alternative implementation, a single wireless communication node may be mounted upon the roof of the vehicle 115. The personal communication device 120 may communicate with the vehicle computer 110 and/or the passive key hands-free management system 105 via one or more of the wireless communication nodes 130a, 130b, 130c, and 130d, so as to allow, the individual 135 (a driver of the vehicle 115, for example) to unlock a door of the vehicle 115 or to start the engine before entering the vehicle 115.

The passive key hands-free management system 105 may use a wireless communication link 121 and some or all of the wireless communication nodes 130a, 130b, 130c, and 130d to execute a distance measuring procedure to determine a location of the personal communication device 120 with respect to the vehicle 115. In one example implementation, the passive key hands-free management system 105 may use one or more of the wireless communication nodes 130a, 130b, 130c, and 130d to perform the distance measuring procedure using one or more of various techniques, such as, for example, a received signal strength indication (RSSI) technique, a time-of-flight (ToF) trilateration procedure, an Angle-of-Arrival (AoA) technique, Angle-of-Departure (AoD) technique, and/or a radio frequency identification (RFID) technique.

In some cases, the vehicle 115 may include a door access panel 160 that may be located on an individual-side door of the vehicle. Similar keypads may be located on other doors of the vehicle 115. A keypad code that is selected by the driver of the vehicle 115 can be used to operate the door access panel 160 for unlocking and/or opening the driver-side door of the vehicle 115. The passive key hands-free management system 105 may manage various operations associated with the door access panel 160, such as verifying a keypad code entered into the door access panel 160 and/or processing a request for a new keypad code.

In the example embodiment shown in FIG. 1, the passive key hands-free management system 105 is communicatively coupled to a server computer 140 via a network 150. The network 150 may include any one, or a combination of networks, such as a local area network (LAN), a wide area network (WAN), a telephone network, a cellular network, a cable network, a wireless network, and/or private/public networks, such as the Internet. For example, the network 150 may support communication technologies, such as Bluetooth®, cellular, UWB, near-field communication (NFC), Wi-Fi, Wi-Fi direct, Li-Fi, Acoustic or Ultrasonic communication, machine-to-machine communication, and/or man-to-machine communication. At least one portion of the network 150 includes a wireless communication link that allows the server computer 140 to communicate with one or more of the wireless communication nodes 130a, 130b, 130c, and 130d on the vehicle 115. The server computer 140 may communicate with the passive key hands-free management system 105 for various purposes, such as for authenticating the personal communication device 120 and/or for identifying an authorized user of the personal communication device 120.

The individual 135 who is shown carrying the personal communication device 120 in one hand and wearing a wearable device 125 on his/her wrist of the other arm is moving towards the vehicle 115 (indicated by arrow 101). The wearable device 125 supports wireless communications with the personal communication device 120. In an embodiment in accordance with the disclosure, the wearable device 125 communicates with the personal communication device 120 using Ultra-Wide Band (UWB) communications. UWB communications typically involves transmission of short pulses in a wireless frequency band (between 3.6 and 10.1 GHz, for example) for communications purposes as well as for other applications.

One such application in accordance with the disclosure, is directed at measuring a separation distance between the wearable device 125 and the personal communication device 120. The separation distance between the wearable device 125 and the personal communication device 120 can be measured using various techniques, such as, for example, a ToF technique, an AoA/AoD technique, or a RFID technique. Using UWB for such applications provides certain benefits because UWB signals are significantly less affected by multipath fading, absorption by objects, and can offer precision measurement down to centimeter levels. Furthermore, due to the high frequency and short wavelength, UWB transceivers can be small and added to portable devices using small size transmitters and receivers making the technology very suitable for the wearable device 125.

The wearable device 125 may be worn on either the left wrist or the right wrist of the individual 135. Typically, the individual 135 provides input to the wearable device 125 during an initializing procedure of the wearable device 125 to indicate a preference of one wrist over the other. In the example scenario shown in FIG. 1, the wearable device 125 is programmed to store information that indicates that the wearable device 125 is being worn on the left wrist of the individual 135.

In the illustrated scenario, the personal communication device 120 is being carried in the right hand of the individual 135. In other scenarios, the personal communication device 120 can be located anywhere inside a personal space of the individual 135. The personal space includes, for example, any body part of the individual 135 (hand, shoulder, neck, upper arm, leg, etc.), any item of clothing worn by the individual 135 (shirt, pant, shorts, trousers, dress, etc.), and any accessory carried by the individual 135 (purse, handbag, backpack, money pack, etc.).

Figure 2:
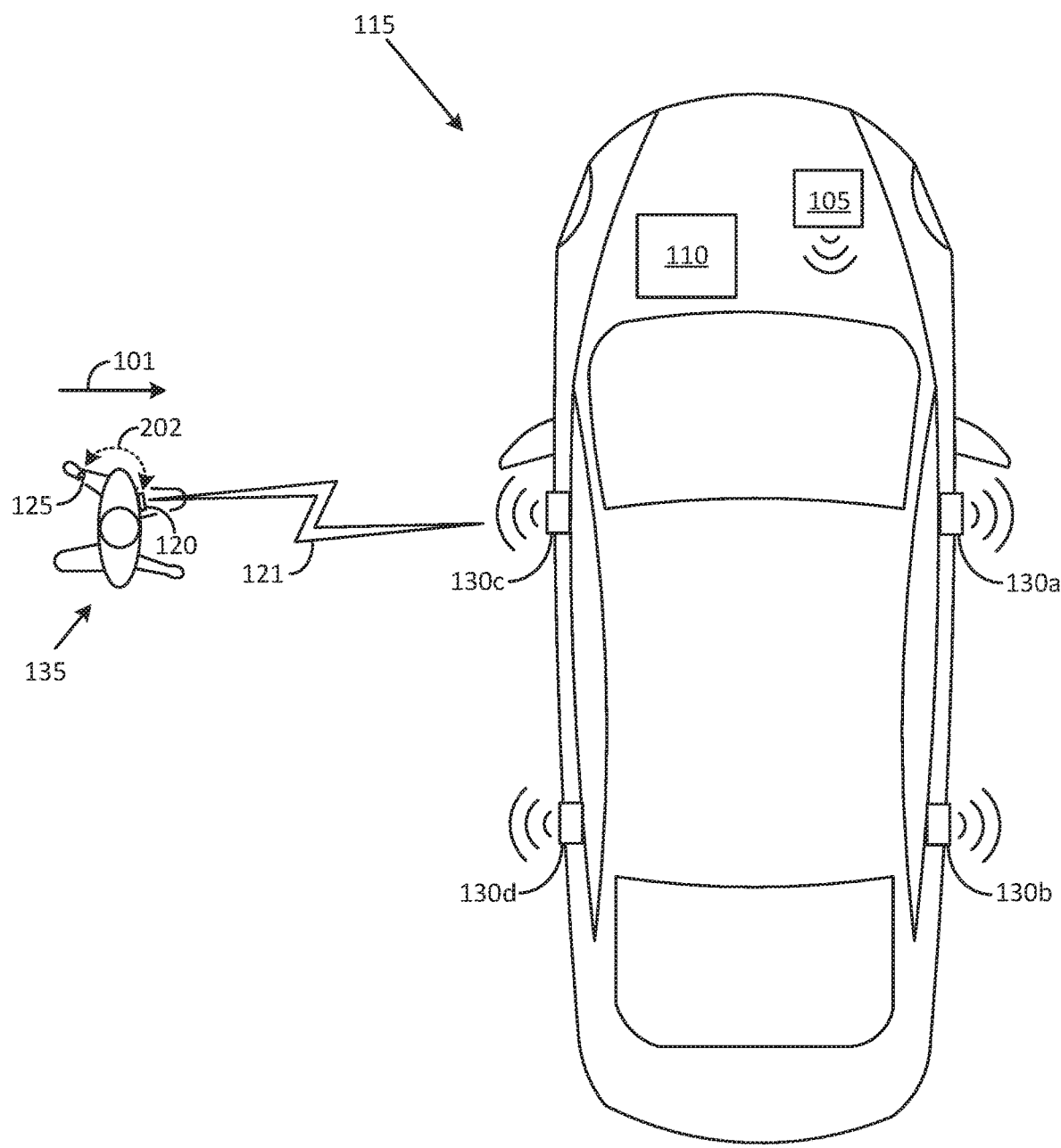
FIG. 2 illustrates a second example scenario where an individual is moving towards a vehicle that supports passive key hands-free operations in accordance with an embodiment of the disclosure.

FIG. 2 illustrates a second example scenario where the individual 135 is moving towards the vehicle 115 while carrying the personal communication device 120 in a front pocket of an item of clothing (a shirt-pocket, for example). The passive key hands-free management system 105 may use one or more of the wireless communication nodes, such as, for example, the wireless communication node 130a and/or the wireless communication node 130b, to execute a distance measuring procedure to determine a location of the personal communication device 120 with respect to the vehicle 115. Any one of various types of communication protocols may be used for performing the distance measuring procedure.

In one example application, the wireless nodes use Wi-Fi for performing the distance measuring procedure. In another example application, each of the wireless communication nodes is a Bluetooth® low energy module (BLEM) and/or a Bluetooth® low energy antenna module (BLEAM) and Bluetooth® communications can be used to perform an RSSI procedure for determining the location of the personal communication device 120. The RSSI procedure may include measuring a separation distance between a BLEAM and the personal communication device 120. The separation distance can be gauged by evaluating an amplitude of a Bluetooth® signal of the wireless communication link 121. More particularly, the separation distance is inversely proportional to the amplitude of the Bluetooth® signal (stronger signal indicates a smaller separation distance in comparison to a weaker signal). In general, the amplitude of the Bluetooth® signal will exhibit an increasing trend over time as the individual 135 moves towards the vehicle 115 and vice-versa. A direction of movement of the individual 135 with respect to the individual 135 may also be determined by using a compass provided in the wearable device 125.

In the illustrated scenario, no intervening object is present between the personal communication device 120 and the vehicle 115 to attenuate the Bluetooth® signal. The clothing material of the front pocket has no effect, or at best, a negligible effect, upon Bluetooth® signal strength.

The location of the personal communication device 120 in the front pocket of the individual 135 may be confirmed by using the wearable device 125 to execute a measurement procedure to determine a separation distance between the wearable device 125 and the personal communication device 120 at various instances in time. For example, the wearable device 125 may use UWB communications over the communication link 202 to determine a separation distance between the wearable device 125 and the personal communication device 120 at a first instance in time when the arm of the individual 135 (left arm in this case) swings backwards and at a second instance in time when the arm of the individual 135 swings forwards. The position of the arm (backwards, forwards, upwards, downwards, etc.) can be determined by employing inertial sensors in the wearable device 125, such as, for example, an accelerometer and a gyroscope.

The location of the personal communication device 120 in the front pocket of the individual 135 may be confirmed by detecting a smaller separation distance between the wearable device 125 and the personal communication device 120 when the arm of the individual 135 is in a forward position in comparison to the separation distance between the wearable device 125 and the personal communication device 120 when the arm of the individual 135 is in a backward position.

Figure 3:
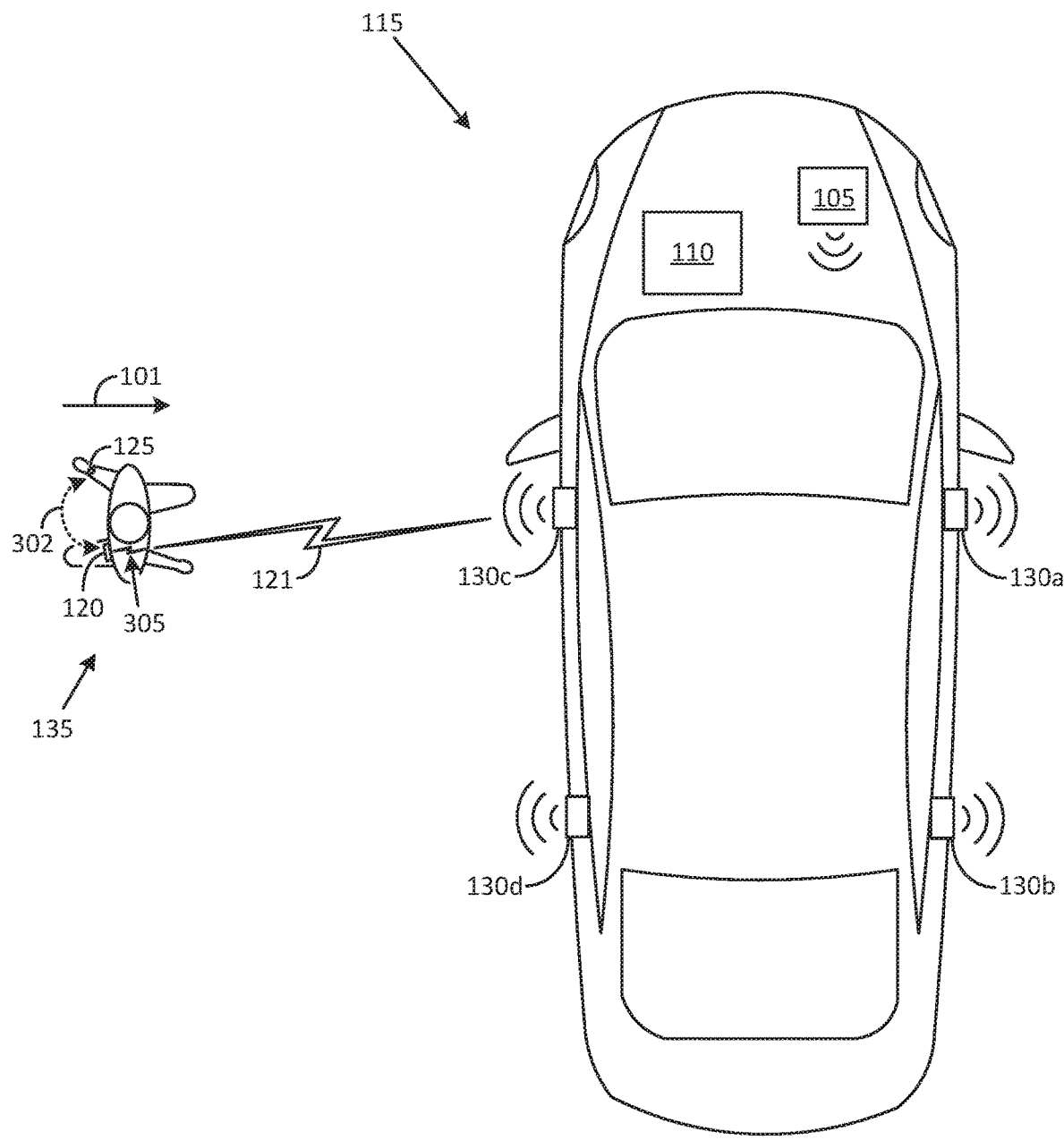
FIG. 3 and FIG. 4 illustrate a third example scenario where an individual is moving towards a vehicle that supports passive key hands-free operations in accordance with an embodiment of the disclosure.
Figure 4:
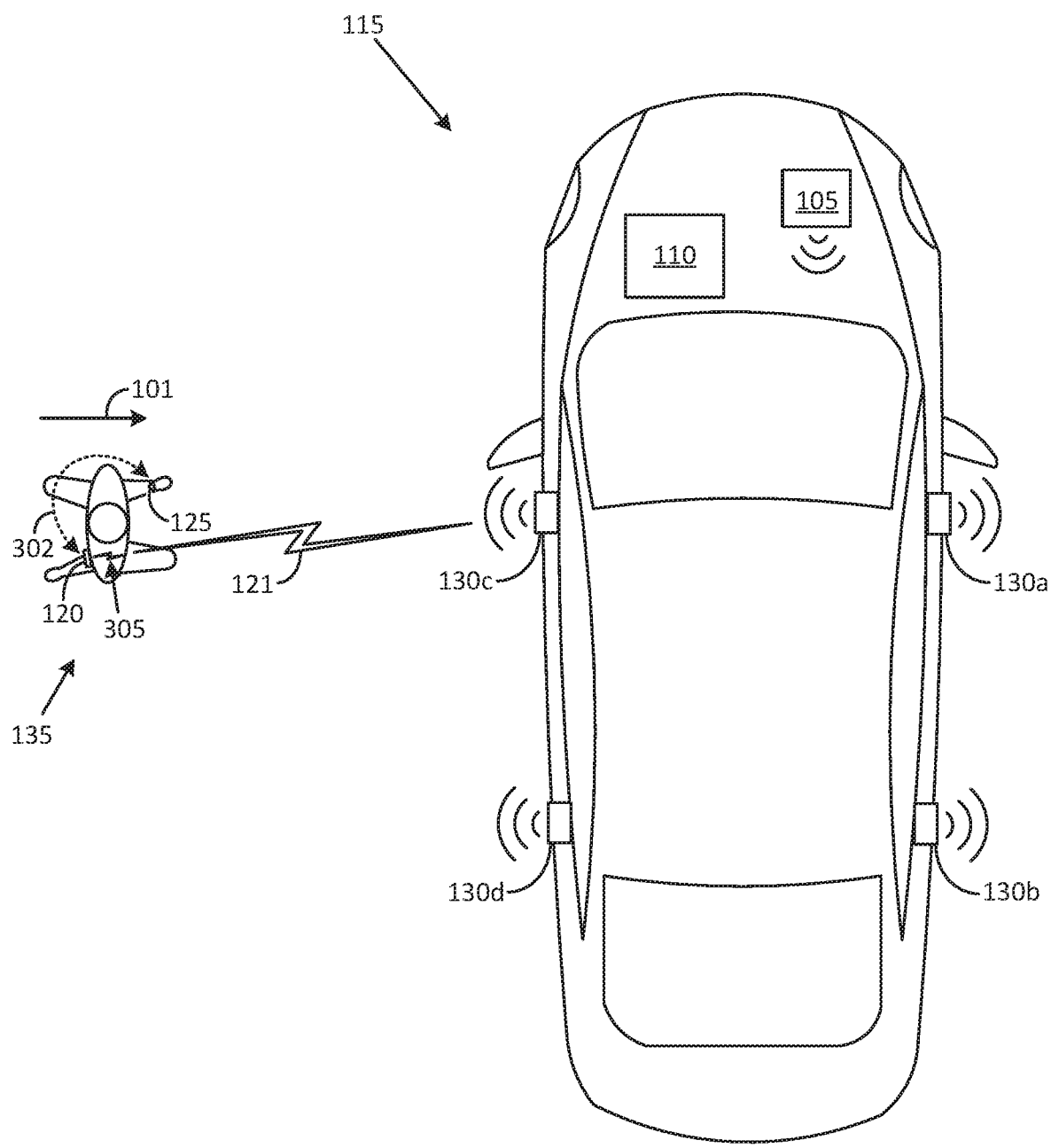

FIG. 3 and FIG. 4 illustrate a third example scenario where the individual 135 is moving towards the vehicle 115 while carrying the personal communication device 120 in a back pocket of an item of clothing (a pant-pocket, for example). The passive key hands-free management system 105 may execute a distance measuring procedure, such as the RSSI procedure described above, in order to determine a location of the personal communication device 120. In this scenario, a body part of the individual 135 (hip section) is intervening between the personal communication device 120 and the vehicle 115. The Bluetooth® signal suffers an attenuation when propagating through the body of the individual 135 (wireless propagation segment 305). The attenuation can be caused by various factors, such as, for example, reflection at an air-skin interface between the personal communication device 120 and the body of the individual 135, and absorption in various layers of human body tissue of the individual 135.

Due to the attenuation, the amplitude of the Bluetooth® signal received by the one or more of the wireless communication nodes (BLEAMs) of the passive key hands-free management system 105 and evaluated by the passive key hands-free management system 105 may produce an erroneous distance measurement. In effect, the passive key hands-free management system 105 may erroneously conclude that the personal communication device 120 is further away from the vehicle 115. A remedial correction may be applied to the erroneous distance measurement upon identifying that an intervening object has caused signal attenuation.

The presence of the intervening object, which is the body of the individual 135 in this example, may be determined by determining a location of the personal communication device 120 on the individual 135. The measurement procedures described above may be applied in this case as well so as to determine a separation distance between the wearable device 125 and the personal communication device 120 at various instances in time. For example, the wearable device 125 may use UWB communications over the communication link 302 to determine a separation distance between the wearable device 125 and the personal communication device 120 at a first instance in time when the arm of the individual 135 (left arm in this case) swings backwards (as illustrated in FIG. 3) and at a second instance in time when the arm of the individual 135 swings forwards (as illustrated in FIG. 4).

The location of the personal communication device 120 in the back pocket of the individual 135 may be confirmed by detecting a smaller separation distance between the wearable device 125 and the personal communication device 120 when the arm of the individual 135 is in a backward position in comparison to the separation distance between the wearable device 125 and the personal communication device 120 when the arm of the individual 135 is in a forward position. FIG. 4 illustrates the second instance in time when the arm of the individual 135 swings forwards.

Figure 5:
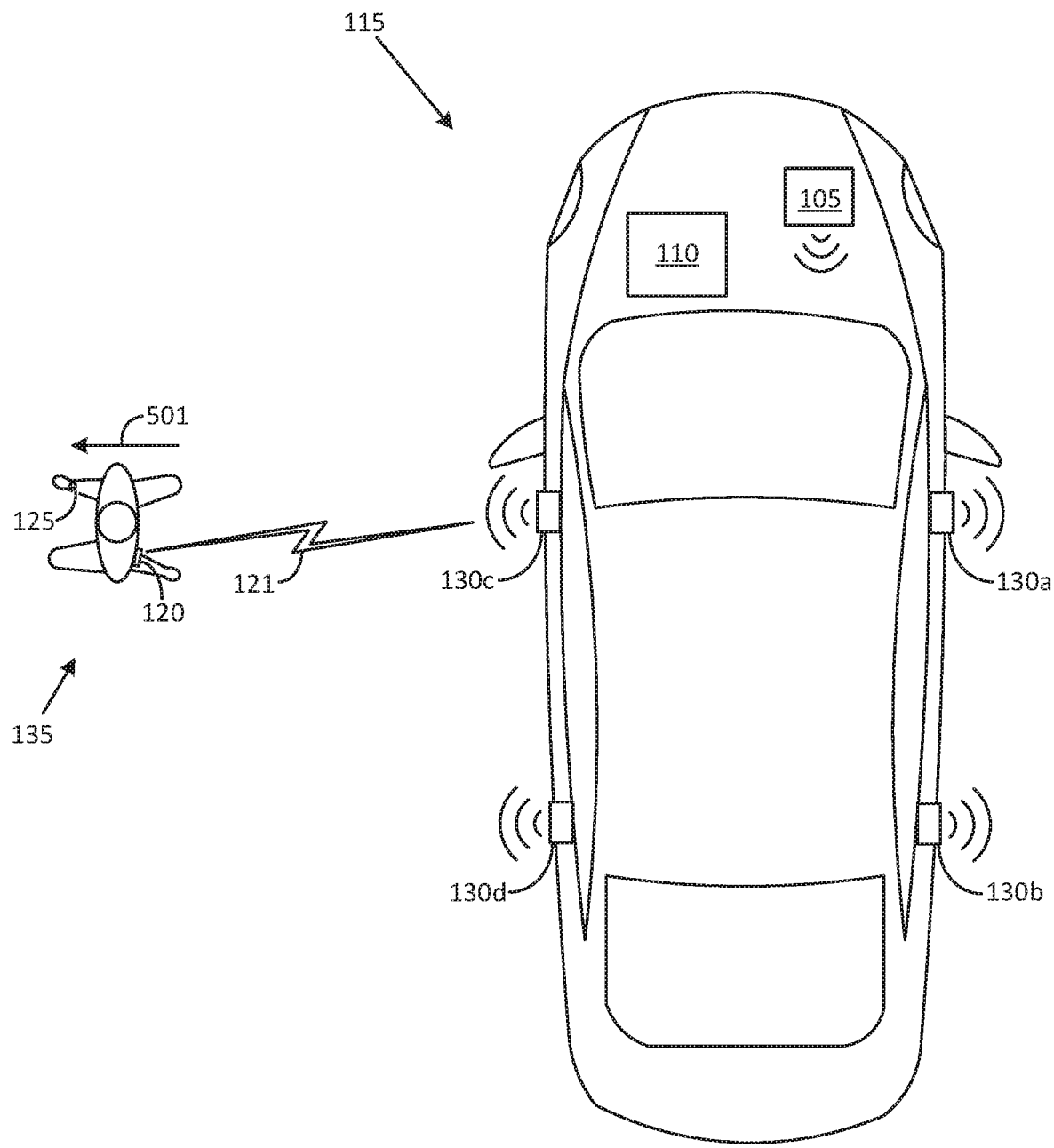
FIG. 5 illustrates a fourth example scenario where an individual is moving away from a vehicle that supports passive key hands-free operations in accordance with an embodiment of the disclosure.

FIG. 5 illustrates a fourth example scenario where the individual 135 is moving away from the vehicle 115 (arrow 501) while carrying the personal communication device 120 in a back pocket of an item of clothing (a pant-pocket, for example). The passive key hands-free management system 105 may execute a distance measuring procedure, such as the RSSI procedure described above, in order to determine a location of the personal communication device 120. In this scenario, there is no intervening object between the personal communication device 120 and the vehicle 115. The Bluetooth® signal reaching the vehicle 115 is unattenuated and the amplitude of the signal can be evaluated by the passive key hands-free management system 105 to obtain an accurate separation distance measurement between the personal communication device 120 and the vehicle 115.

In the illustrated scenario, the amplitude of the Bluetooth® signal will exhibit a decreasing trend over time because the individual 135 is moving away from the vehicle 115. The location of the personal communication device 120 in the back pocket of the individual 135 may be confirmed by executing the measurement procedures described above for determining a separation distance between the wearable device 125 and the personal communication device 120 at various instances in time. A smaller separation distance will be detected between the wearable device 125 and the personal communication device 120 when the arm of the individual 135 is in a backward position in comparison to the separation distance between the wearable device 125 and the personal communication device 120 when the arm of the individual 135 is in a forward position.

In some implementations, the location of the personal communication device 120 on the person of the individual 135 may be deemed irrelevant when the individual 135 is moving away from the vehicle 135, because it is unnecessary for the passive key hands-free management system 105 to apply a compensation procedure to compensate for wireless signal attenuation. It is unlikely in this scenario that the individual 135 intends to enter the vehicle 115.

Figure 6:
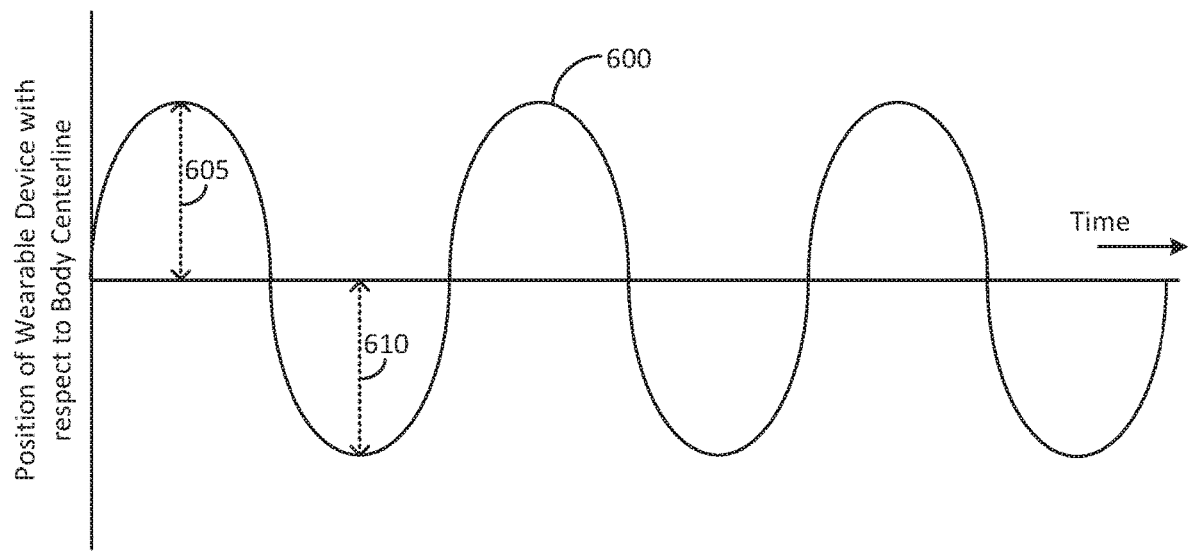
FIG. 6 illustrates a first example waveform pertaining to a distance measurement in a passive key hands-free application in accordance with an embodiment of the disclosure.

FIG. 6 illustrates an example waveform 600 pertaining to distance values corresponding to various positions of the wearable device 125 when the individual 135 swings his/her arms back-and-forth. The waveform 600, which may be generated by obtaining data from one or more inertial sensors of the wearable device 125, is illustrated in a bipolar format where positive excursions indicate distance values of the wearable device 125 with respect to the body of the individual 135 when the arm of the individual 135 is moving in front of the body of the individual 135, and vice-versa.

More particularly, waveform 600 represents a scenario where the individual 135 swings his/her arm forwards (positive excursions of the waveform 600) to the same extent as he/she swings his/her arm backwards (negative excursions of the waveform 600). For example, the distance 605 between the wearable device 125 and the body centerline of the individual 135 when the individual 135 swings his/her arm forwards matches the distance 610 between the wearable device 125 and the body centerline of the individual 135 when the individual 135 swings his/her arm backwards.

Figure 7:
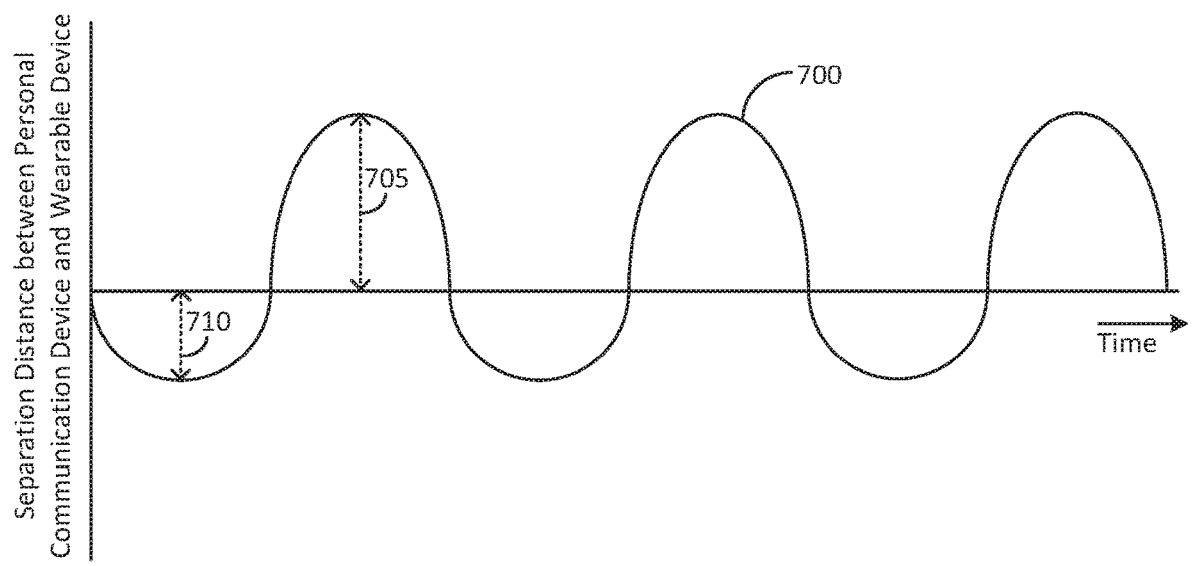
FIG. 7 illustrates a second example waveform pertaining to a distance measurement in a passive key hands-free application in accordance with an embodiment of the disclosure.

FIG. 7 illustrates an example waveform 700 pertaining to a separation distance measurement between the wearable device 125 and the personal communication device 120 in accordance with an embodiment of the disclosure. The waveform 700, which is shown in a bipolar format, reflects a situation where the individual 135 is carrying the personal communication device 120 in a front pocket of an item of clothing (as shown in FIG. 2) or is carrying it in a hand extended in front of his/her body. In this case, the separation distance 705 between the personal communication device 120 and the wearable device 125 when the individual 135 swings his/her arm forwards is less than the separation distance 710 between the personal communication device 120 and the wearable device 125 when the individual 135 swings his/her arm backwards.

Figure 8:
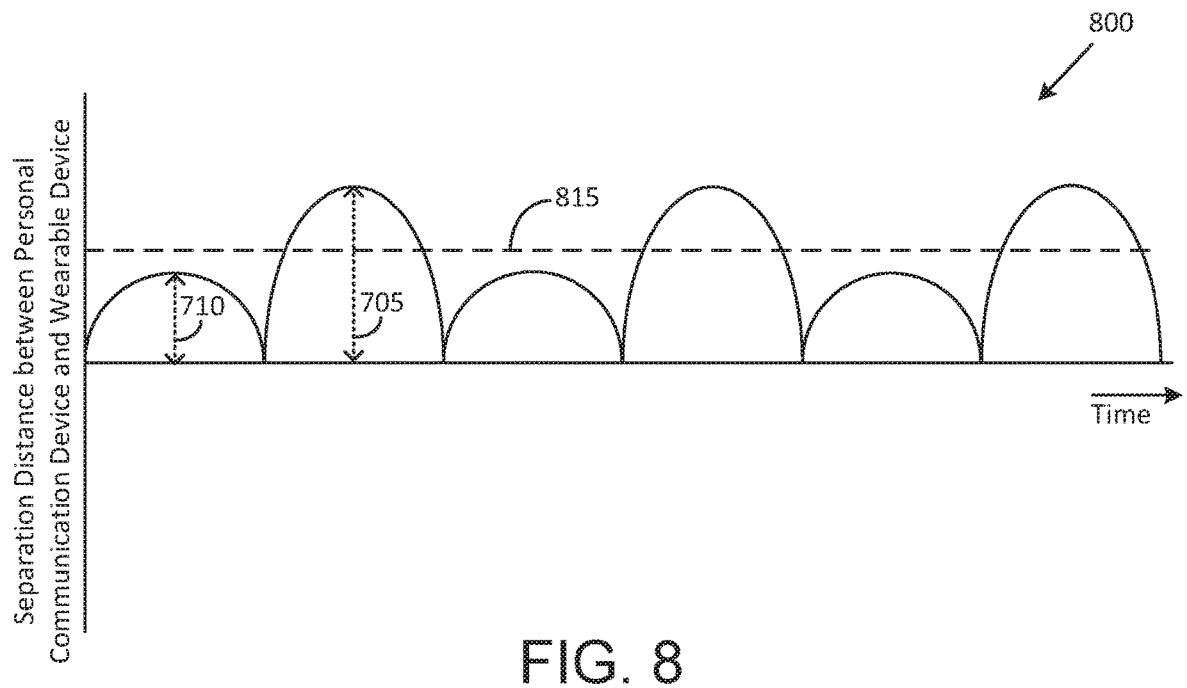
FIG. 8 illustrates a third example waveform pertaining to a distance measurement in a passive key hands-free application in accordance with an embodiment of the disclosure.

FIG. 8 illustrates an example waveform 800 that is a unipolar representation of the waveform 700 described above. Such a unipolar waveform may be generated by employing inertial sensors of the wearable device 125. The unipolar representation may be more suitable for detecting differences in amplitude when the individual 135 swings his/her arm forwards and backwards. In one example implementation, a threshold value 815 may be employed to distinguish between forward and backward arm movements. The measurement procedure carried out by the wearable device 125 and/or the personal communication device 120 may involve evaluating the waveform 700 over a period of time that encompasses several cycles of the waveform 800 so as to obtain a high degree of confidence in the measurement result.

Figure 9:
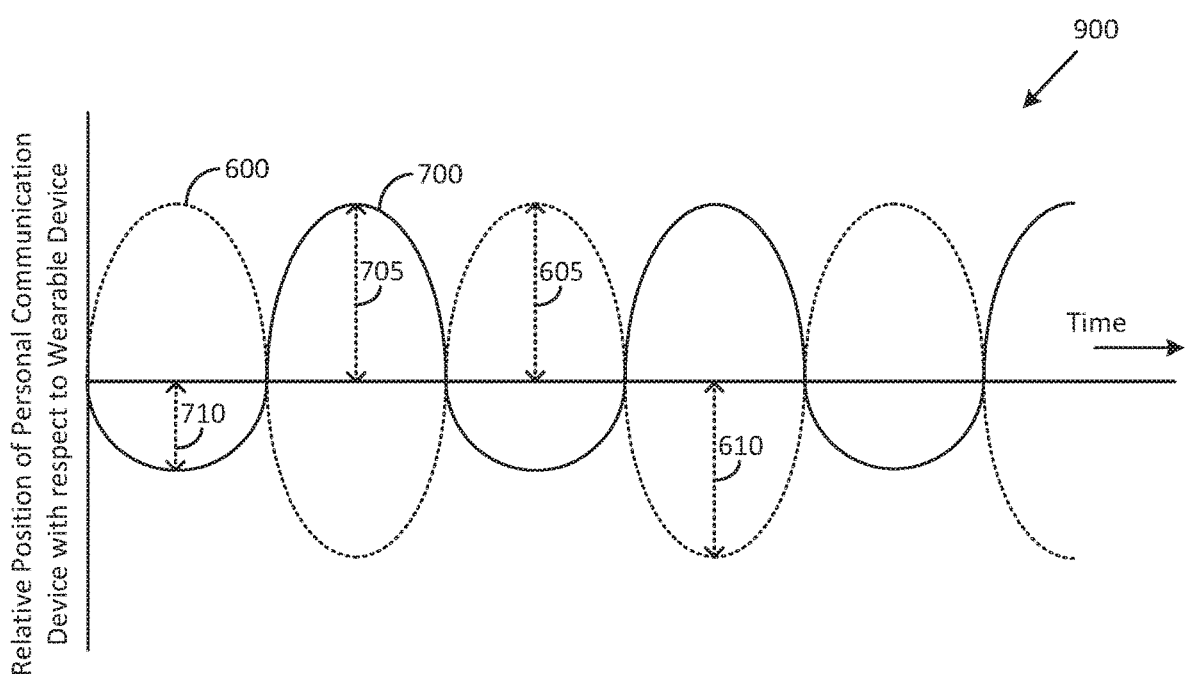
FIG. 9 illustrates a fourth example waveform pertaining to a distance measurement in a passive key hands-free application in accordance with an embodiment of the disclosure.

FIG. 9 illustrates an example composite representation 900 of the waveform 600 and the waveform 700 described above. The composite representation is a bipolar representation that may be suitable for determining various characteristics pertaining to relative positions between the personal communication device 120 and the wearable device 125 and more particularly of a placement of the personal communication device 120 in a front pocket of the individual 135.

Figure 10:
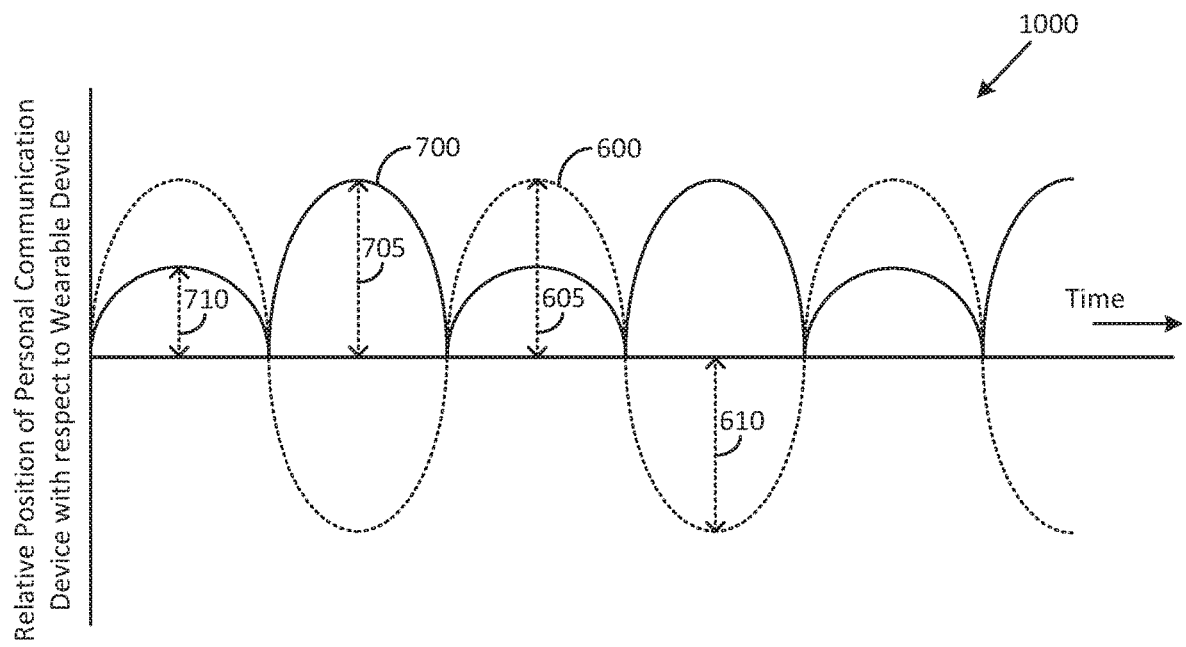
FIG. 10 illustrates a fifth example waveform pertaining to a distance measurement in a passive key hands-free application in accordance with an embodiment of the disclosure.

FIG. 10 illustrates an example composite representation 1000 of the waveform 600 and the waveform 800 described above. As indicated above, waveform 800 is a unipolar representation of the waveform 700.

Figure 11:
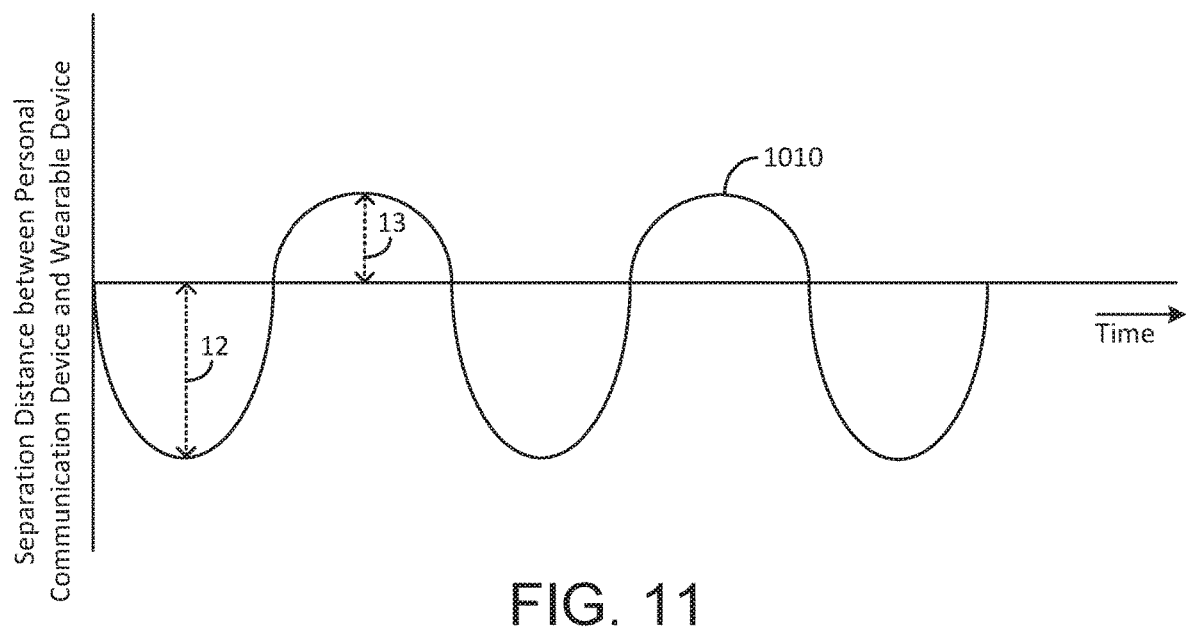
FIG. 11 illustrates a sixth example waveform pertaining to a distance measurement in a passive key hands-free application in accordance with an embodiment of the disclosure.

FIG. 11 illustrates an example waveform 1010 pertaining to a separation distance measurement between the wearable device 125 and the personal communication device 120 in accordance with an embodiment of the disclosure. The waveform 1010, which is shown in a bipolar format, reflects a situation where the individual 135 is carrying the personal communication device 120 in a back pocket of an item of clothing (as shown in FIG. 3 and FIG. 4). In this case, the separation distance 12 between the personal communication device 120 and the wearable device 125 when the individual 135 swings his/her arm forwards is greater than the separation distance 13 between the personal communication device 120 and the wearable device 125 when the individual 135 swings his/her arm backwards.

Figure 12:
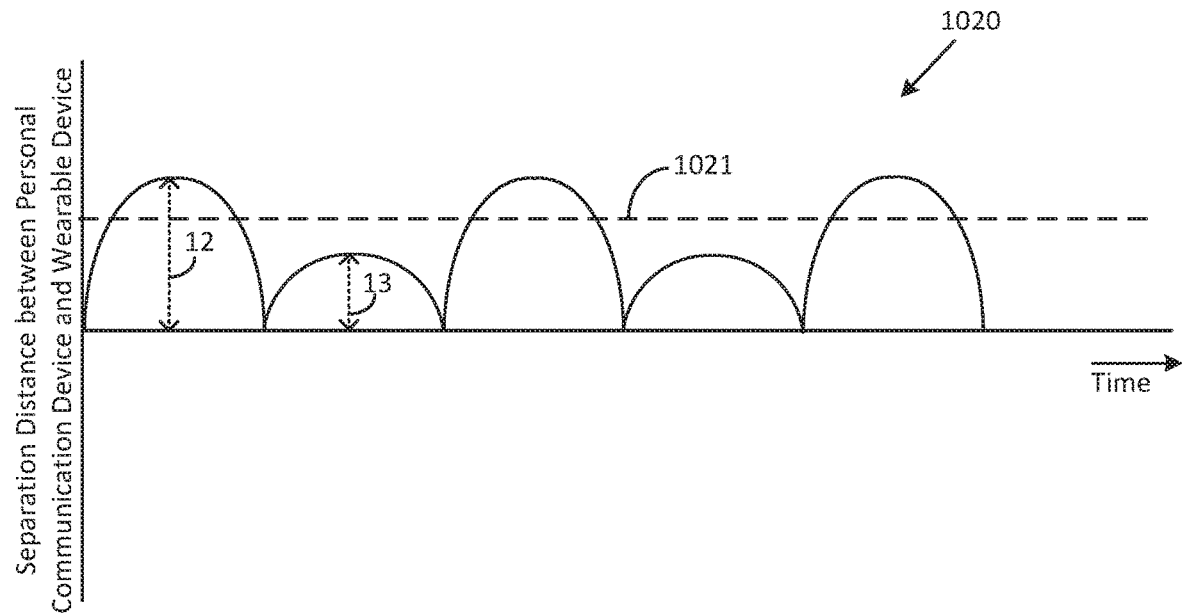
FIG. 12 illustrates a seventh example waveform pertaining to a distance measurement in a passive key hands-free application in accordance with an embodiment of the disclosure.

FIG. 12 illustrates an example waveform 1020 that is a unipolar representation of the waveform 1010 described above. Such a unipolar waveform may be generated by employing inertial sensors of the wearable device 125. The unipolar representation may be more suitable for detecting differences in amplitude when the individual 135 swings his/her arm forwards and backwards. In one example implementation, a threshold value 1021 may be employed to distinguish between forward and backward arm movements. The measurement procedure carried out by the wearable device 125 and/or the personal communication device 120 may involve evaluating the waveform 1020 over a period of time that encompasses several cycles of the waveform 1020 so as to obtain a high degree of confidence in the measurement result.

Figure 13:
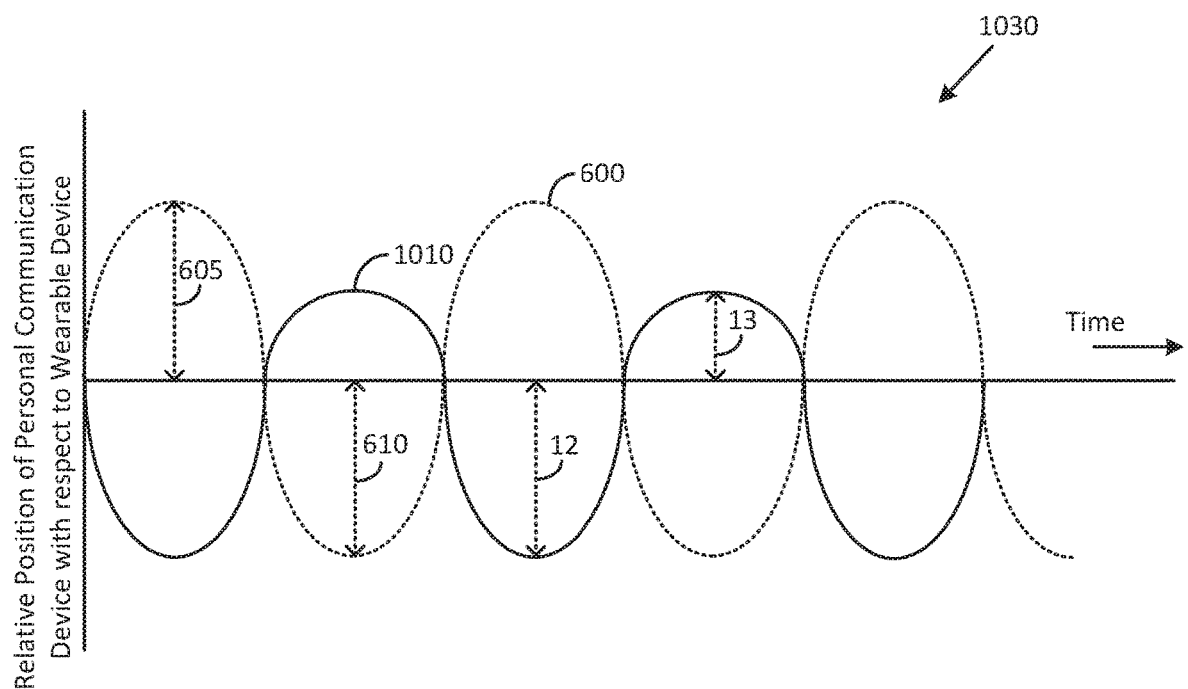
FIG. 13 illustrates an eighth example waveform pertaining to a distance measurement in a passive key hands-free application in accordance with an embodiment of the disclosure.

FIG. 13 illustrates an example waveform 1030 that is a composite representation of the waveform 600 and the waveform 1010 described above. The composite representation is a bipolar representation that may be suitable for determining various characteristics pertaining to relative positions between the personal communication device 120 and the wearable device 125 and more particularly of a placement of the personal communication device 120 in a back pocket of the individual 135.

Figure 14:
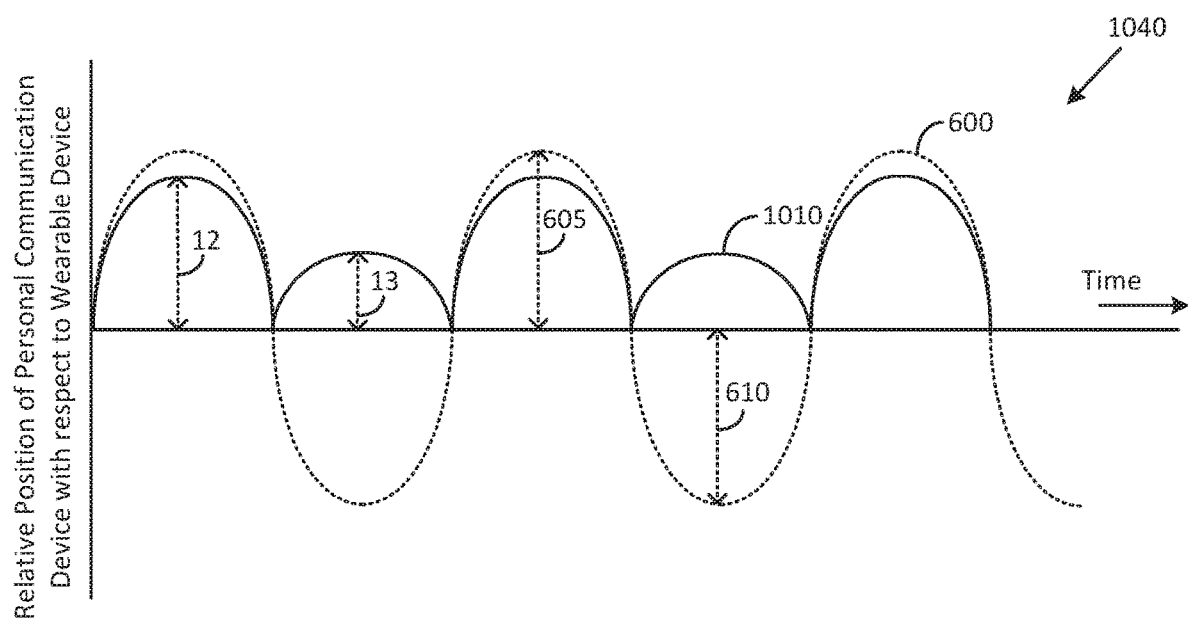
FIG. 14 illustrates a ninth example waveform pertaining to a distance measurement in a passive key hands-free application in accordance with an embodiment of the disclosure.

FIG. 14 illustrates an example waveform 1040 that is a composite representation of the waveform 600 and the waveform 1020 described above. As indicated above, waveform 1020 is a unipolar representation of the waveform 1010.

The description above pertains to one example procedure that uses an interaction between the personal communication device 120 and the wearable device 125 to identify a carrying location of the personal communication device 120 (back pocket, front pocket, etc.) and to inform the passive key hands-free management system 105 of the carrying location so to enable the passive key hands-free management system 105 to compensate for wireless signal attenuation when wireless signal attenuation is present due to an intervening object.

In an alternative approach in accordance with the disclosure, the carrying location of the personal communication device 120 may be identified by using sensing elements of the wearable device 125 to determine at a first instant in time that the individual 135 has extended his/her right foot forwards when moving towards the vehicle 115. Typically, the individual 135 would swing his/her left arm backwards when his/her right foot is extended forwards and vice-versa. Consequently, detecting movements of the feet of the individual 135 offers a way to detect the position of the arms of the individual 135 at various instants in time. This information may be used to detect a separation distance between the wearable device 125 and the personal communication device 120 at various times and to determine the carrying location of the personal communication device 120.

Figures 15, 16, 17:
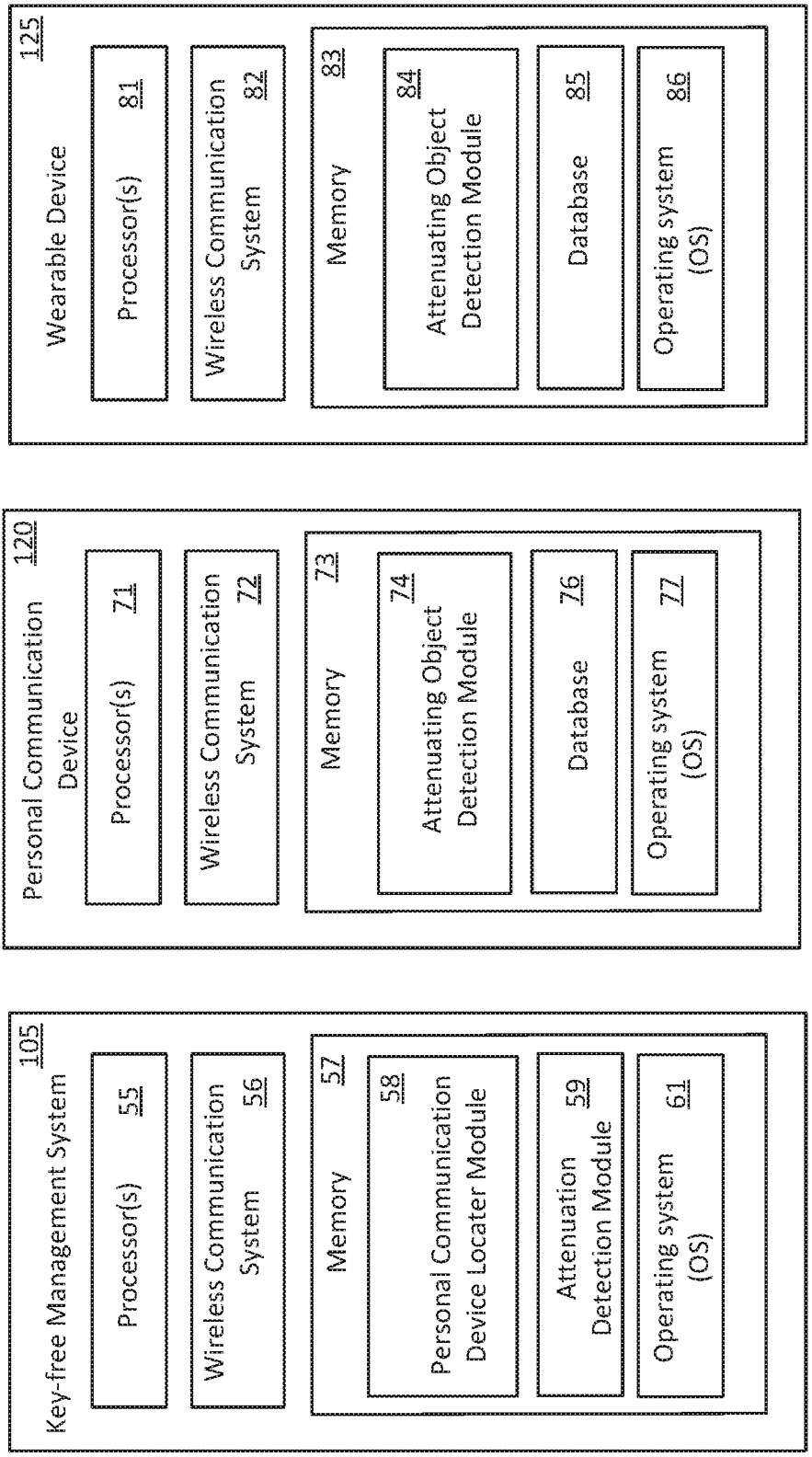
FIG. 15 illustrates some example components that can be included in a passive key hands-free management system of a vehicle in accordance with an embodiment of the disclosure.
FIG. 16 illustrates some example components that can be included in a personal communication device (PCD) in accordance with an embodiment of the disclosure.
FIG. 17 illustrates some example components that can be included in a wearable device in accordance with an embodiment of the disclosure.

FIG. 15 shows some example components that may be included in the passive key hands-free management system 105. The example components may include a processor 55, a wireless communication system 56, and a memory 57. The wireless communication system 56 can include various wireless communication elements, such as, for example, the wireless communication nodes 130a, 130b, 130c, and 130d described herein. In one example implementation, some or all of the wireless communication nodes can include a Bluetooth® low energy module (BLEM) and/or a Bluetooth® low energy antenna module (BLEAM). The wireless communication system 56 can be used by the passive key hands-free management system 105 to communicate with one or more personal communication devices located inside or outside the vehicle 115, such as, for example, the personal communication device 120 described herein.

The memory 57, which is one example of a non-transitory computer-readable medium, may be used to store an operating system (OS) 61 and various code modules, such as a personal communication device locater module 58 and an attenuation detection module 59. The code modules are provided in the form of computer-executable instructions that can be executed by the processor 55 for performing various operations in accordance with the disclosure.

The personal communication device locater module 58 may be executed by the processor 55 for sensing the presence of, and locating, a personal communication device that is close to the vehicle 115. In one example implementation that is described below using the various example elements illustrated in other figures of this disclosure, the personal communication device locater module 58 utilizes the wireless communication system 56 to perform Bluetooth® pairing with the personal communication device 120 as the individual 135 approaches the vehicle 115. When successfully paired, the personal communication device locater module 58 initiates a wireless signal procedure to determine the location of the personal communication device 120. A part of the wireless signal procedure includes a distance measurement to measure a separation distance between the personal communication device 120 and the vehicle 115. The measurement may be carried out by using one or more of various techniques, such as, for example, a received signal strength indication (RSSI) technique, a time-of-flight (ToF) trilateration procedure, an Angle-of-Arrival (AoA) technique, Angle-of-Departure (AoD) technique, and/or a radio frequency identification (RFID) technique.

The RSSI technique involves calculating the separation distance based on a signal strength of a wireless signal received by the passive key hands-free management system 105 from the personal communication device 120. The accuracy of this measurement relies on the signal strength of the received wireless signal being accurately proportional to the distance over which the wireless signal has propagated. However, in some cases, an intervening object may attenuate the wireless signal and, if not taken into consideration, lead to the conclusion that the personal communication device 120 is farther away from the vehicle 115 than in actuality. Consequently, the processor 55 may execute the attenuation detection module 59 to determine a location of the personal communication device 120 on the person of the individual 135. As a part of the procedure, a wireless signal command may be transmitted from the passive key hands-free management system 105 to the personal communication device 120 and/or the wearable device 125 to perform a detection procedure. The detection procedure may involve determining a separation distance between the wearable device 125 and the personal communication device 120 at a first instance in time when the arm of the individual 135 swings in one direction and at a second instance in time when the arm of the individual 135 swings in an opposite direction as described above using various figures.

The personal communication device 120 may convey the results of the detection procedure in various ways, such as, for example, an indication that the personal communication device 120 is located in a back pocket of the individual 135 or in a handbag carried by the individual 135. The passive key hands-free management system 105 may apply a compensating factor to the wireless signal strength measurement (RSSI) based on the nature of the intervening object. For example, the passive key hands-free management system 105 may apply a first compensating factor when the personal communication device 120 is located in the back pocket of the individual 135 when moving towards the vehicle 115. The first compensating factor may be applicable to human body tissue because the intervening object in this case is a body part of the individual 135. The passive key hands-free management system 105 may apply a second compensating factor when the personal communication device 120 is located in a handbag carried by the individual 135 when moving towards the vehicle 115. The second compensating factor may be different than the first compensating factor and may be selected based on the type of material of the handbag.

In an alternative implementation, the personal communication device 120 may convey the results of the detection procedure in the form of a flag. For example, a "1" flag can indicate to the personal communication device locater module 58 that attenuation compensation has to be applied. Conversely, a "0" flag can indicate to the personal communication device locater module 58 that no attenuation compensation is to be applied. In some applications, the passive key hands-free management system 105 may desist from apply the compensating factor when no signal or flag is received from the personal communication device 120. Desisting from applying the compensating factor provides a default mode of operation under various circumstances, such as, for example, when the individual 135 is not wearing the wearable device 125 or when the wearable device 125 is not configured to interact with the personal communication device for detecting the carrying location of the personal communication device 120 on the individual 135.

In some implementations, the personal communication device 120 may convey to the passive key hands-free management system 105 information pertaining to a direction of movement of the individual 135 with respect to the vehicle 115. For example, the personal communication device 120 may convey to the passive key hands-free management system 105 a "1" flag to indicate that the individual 135 is moving towards the vehicle 115 and a "0" flag to indicate that the individual 135 is moving away from the vehicle 115.

FIG. 16 shows some example components that may be included in the personal communication device 120. The example components may include a processor 71, a wireless communication system 72, and a memory 73. The wireless communication system 72 can include various types of wireless communication elements. In one embodiment in accordance with the disclosure, the wireless communication system 72 supports UWB communications that may be used to communicate with the wearable device 125, for example.

The memory 73, which is another example of a non-transitory computer-readable medium, may be used to store an operating system (OS) 61, a database 76, and various code modules, such as an attenuating object detection module 74. The code modules are provided in the form of computer-executable instructions that can be executed by the processor 71 for performing various operations in accordance with the disclosure.

The attenuating object detection module 74 may be executed by the processor 71 upon receiving a wireless signal command from the passive key hands-free management system 105 to perform a detection procedure for detecting a location of the personal communication device 120 inside a personal space of the individual 135. As described above, the detection procedure may involve determining a separation distance between the personal communication device 120 and the wearable device 125 at a first instance in time when the arm of the individual 135 swings in one direction and at a second instance in time when the arm of the individual 135 swings in an opposite direction.

The processor 71 may access the database 76 for executing the detection procedure. For example, the processor may access the database 76 to fetch various types of data, such as, for example, the waveform 600 described above. The database 76 may also contain historic data, such as, for example, previous locations of the personal communication device 120 upon the individual 135, parameters related to various waveforms (amplitude information, time-related information, etc.), and personal preferences of the individual 135.

The personal communication device 120 may convey the results of the detection procedure to the passive key hands-free management system 105 in various ways, such as in the form of a flag or in the form of information.

FIG. 17 shows some example components that may be included in the wearable device 125. The example components may include a processor 81, a wireless communication system 82, and a memory 83. The wireless communication system 82 can include various types of wireless communication elements. In one embodiment in accordance with the disclosure, the wireless communication system 82 supports UWB communications that may be used to communicate with the personal communication device 120, for example.

The memory 83, which is yet another example of a non-transitory computer-readable medium, may be used to store an operating system (OS) 86, a database 85, and various code modules, such as an attenuating object detection module 84. The code modules are provided in the form of computer-executable instructions that can be executed by the processor 81 for performing various operations in accordance with the disclosure.

The attenuating object detection module 84 may be executed by the processor 81 upon receiving a wireless signal command from the personal communication device 120 for performing a detection procedure for detecting a location of the wearable device 125 inside a personal space of the individual 135. As described above, the detection procedure may involve determining a separation distance between the wearable device 125 and the personal communication device 120 at a first instance in time when the arm of the individual 135 swings in one direction and at a second instance in time when the arm of the individual 135 swings in an opposite direction.

The processor 81 may access the database 85 for executing the detection procedure. For example, the processor may access the database 85 to fetch various types of data, such as, for example, information about a location of the wearable device 125 on the individual 135 (left wrist, right wrist, etc.), a direction of movement of the individual 135 with respect to the vehicle 115 (compass information, for example), hand swing action related information, and personal preferences of the individual 135.

Figure 18:
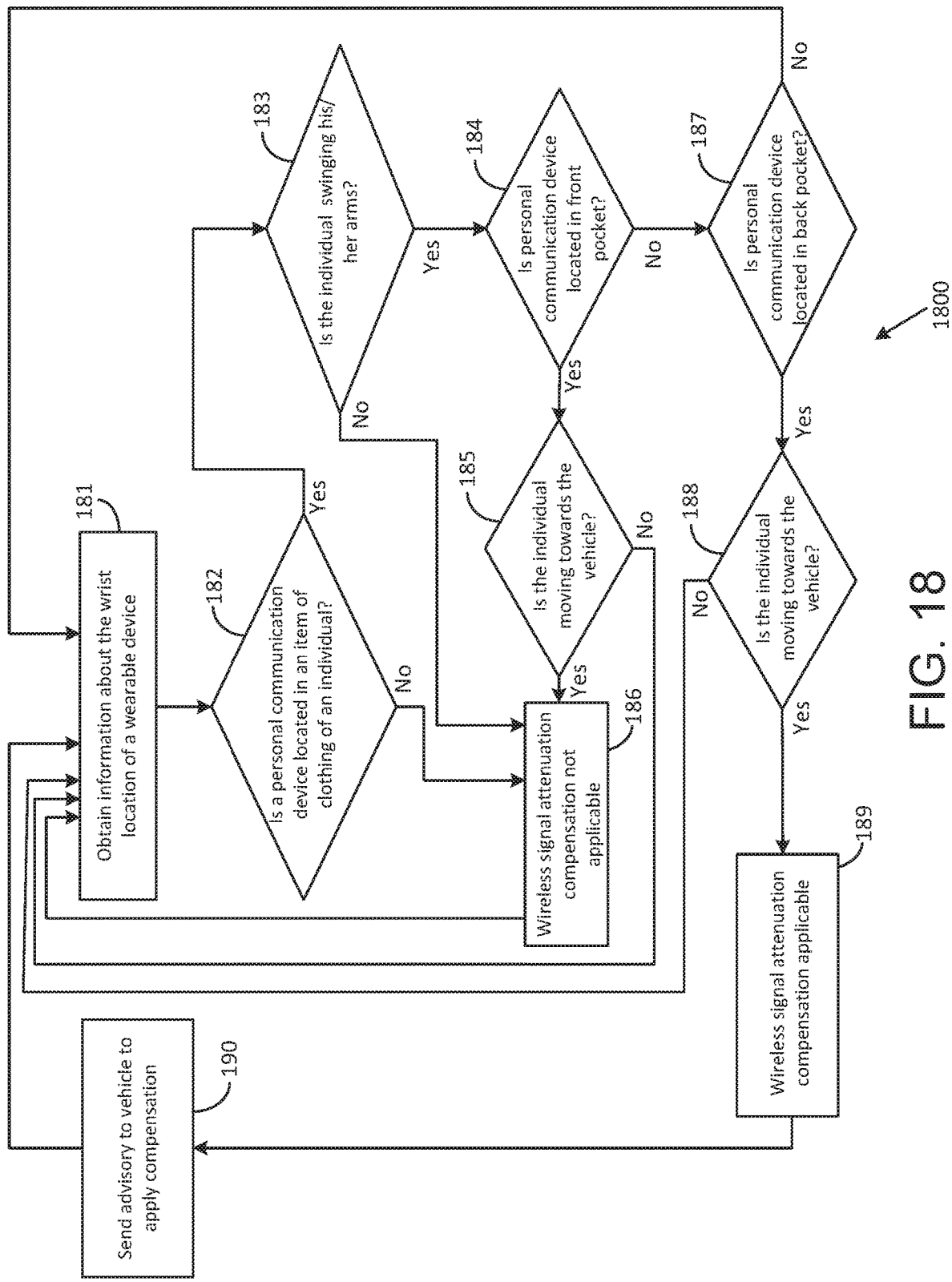
FIG. 18 shows a flowchart of an example method to compensate for attenuation suffered by a wireless signal received by a vehicle from a personal communication device.

FIG. 18 shows a flowchart 1800 of an example method in accordance with the disclosure to compensate for attenuation suffered by a wireless signal received by a vehicle from a personal communication device. The flowchart 1800 illustrates a sequence of operations that can be implemented in hardware, software, or a combination thereof. In the context of software, the operations represent computer-executable instructions stored on one or more non-transitory computer-readable media, such as the memory 57, the memory 73, and the memory 83, that, when executed by one or more processors, such as the processor 55, the processor 71, and the processor 81, respectively, perform the recited operations. Generally, computer-executable instructions include routines, programs, objects, components, data structures, and the like that perform particular functions or implement particular abstract data types. The order in which the operations are described is not intended to be construed as a limitation, and any number of the described operations may be carried out in a different order, omitted, combined in any order, and/or carried out in parallel. Some or all of the operations described in the flowchart 1800 may be carried out by using the passive key hands-free management system 105, the personal communication device 120, and/or the wearable device 125. The description below may make reference to certain components and objects shown in other figures, but it should be understood that this is done for purposes of explaining certain aspects of the disclosure and that the description is equally applicable to various other embodiments.

At block 181, the personal communication device 120 communicates with the wearable device 125 to obtain information about the wrist location of the wearable device 125 (left wrist or right wrist of the individual 135). In one embodiment in accordance with the disclosure, the wearable device 125 uses UWB communications to provide the information to the personal communication device 120.

At block 182, a determination is made whether the personal communication device 120 (a smartphone, for example) is located inside an item of clothing of the individual 135, such as, in a front pocket of a shirt or a pant back pocket. This determination may be made using one or more sensors in the personal communication device 120.

If the personal communication device 120 is not located inside an item of clothing of the individual 135, at block 186, an assumption is made that no wireless signal attenuation compensation is necessary or is applicable. This assumption may be considered as a default assumption and may be applicable to situations, such as, for example, when the individual 135 is carrying the personal communication device 120 in his/her hand.

If the personal communication device 120 is located inside an item of clothing of the individual 135, at block 183, a determination is made whether the individual 135 is swinging his/her arms.

If the individual 135 is not swinging his/her arms, at block 186, an assumption is made that no wireless signal attenuation compensation is applicable. This assumption may be considered as a default assumption and is applicable to situations where the individual 135 may not be swinging his/her arms for various reasons. For example, the individual 135 may be carrying an item (or items) that prevents him/her from swinging his/her arms while moving towards the vehicle 115. The items may be, for example, a suitcase in each arm or a baby supported by both arms.

If the individual 135 is swinging his/her arms, at block 184, a determination is made whether the personal communication device 120 is located in a front portion of the individual 135, such as, for example, in a front pocket of an item of clothing worn by the individual 135. The determination may be made using procedures, such as the example procedures described above.

If at block 184 it is determined that the personal communication device 120 is located in a front portion of the individual 135, at block 185 a determination is made whether the individual 135 is moving towards the vehicle 115.

If the individual is moving towards the vehicle 115, at block 186, it is determined that wireless signal attenuation compensation is not applicable because there is no intervening object between the personal communication device 120 and the vehicle 115.

If the individual is not moving towards the vehicle 115, the actions indicated in block 181 and subsequent blocks are repeated. In one example implementation, information may be sent from the personal communication device 120 to the passive key hands-free management system 105 that the individual 135 is walking away from the vehicle 115 and actions, such as, for example, locking the doors of the vehicle 115 may be carried out by the passive key hands-free management system 105.

If at block 184 it is determined that the personal communication device 120 is not located in a front portion of the individual 135, at block 187, a determination is made whether the personal communication device 120 is located in a rear portion of the individual 135, such as, for example, in a back pocket of an item of clothing worn by the individual 135. The determination may be made using procedures, such as the example procedures described above.

If at block 187 it is determined that the personal communication device 120 is not located in a rear portion of the individual 135, the actions indicated in block 181 and subsequent blocks are repeated.

If at block 187 it is determined that the personal communication device 120 is located in a rear portion of the individual 135, at block 188, a determination is made whether the individual 135 is moving towards the vehicle 115.

If the individual is moving towards the vehicle 115, at block 189, it is determined that wireless signal attenuation compensation is applicable because the body of the individual 115 is intervening between the personal communication device 120 and the vehicle 115. Consequently, at block 190 a signal advisory (or flag) is sent from the personal communication device 120 to the vehicle 115 to advise the passive key hands-free management system 105 to compensate for signal attenuation.

If the individual 135 is moving away from the vehicle 115 (and is carrying the personal communication device 120 in a back pocket as per block 186), signal attenuation compensation is not applicable. Hence, no signal advisory is sent to the vehicle 115 and actions indicated at block 181 and subsequent blocks may be executed in this case.

In the above disclosure, reference has been made to the accompanying drawings, which form a part hereof, which illustrate specific implementations in which the present disclosure may be practiced. It is understood that other implementations may be utilized, and structural changes may be made without departing from the scope of the present disclosure. References in the specification to "one embodiment," "an embodiment," "an example embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, one skilled in the art will recognize such feature, structure, or characteristic in connection with other embodiments whether or not explicitly described.

Implementations of the systems, apparatuses, devices, and methods disclosed herein may comprise or utilize one or more devices that include hardware, such as, for example, one or more processors and system memory, as discussed herein. An implementation of the devices, systems, and methods disclosed herein may communicate over a computer network. A "network" is defined as one or more data links that enable the transport of electronic data between computer systems and/or modules and/or other electronic devices. When information is transferred or provided over a network or another communications connection (either hardwired, wireless, or any combination of hardwired or wireless) to a computer, the computer properly views the connection as a transmission medium. Transmission media can include a network and/or data links, which can be used to carry desired program code means in the form of computer-executable instructions or data structures and which can be accessed by a general purpose or special purpose computer. Combinations of the above should also be included within the scope of non-transitory computer-readable media.

Computer-executable instructions comprise, for example, instructions and data which, when executed at a processor, cause the processor to perform a certain function or group of functions. The computer-executable instructions may be, for example, binaries, intermediate format instructions, such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

A memory device, such as the memory 57, the memory 73, or the memory 83, can include any one memory element or a combination of volatile memory elements (e.g., random access memory (RAM, such as DRAM, SRAM, SDRAM, etc.)) and non-volatile memory elements (e.g., ROM, hard drive, tape, CDROM, etc.). Moreover, the memory device may incorporate electronic, magnetic, optical, and/or other types of storage media. In the context of this document, a "non-transitory computer-readable medium" can be, for example but not limited to, an electronic, magnetic, optical, electromagnetic, infrared, or semiconductor system, apparatus, or device. More specific examples (a non-exhaustive list) of the computer-readable medium would include the following: a portable computer diskette (magnetic), a random-access memory (RAM) (electronic), a read-only memory (ROM) (electronic), an erasable programmable read-only memory (EPROM, EEPROM, or Flash memory) (electronic), and a portable compact disc read-only memory (CD ROM) (optical). Note that the computer-readable medium could even be paper or another suitable medium upon which the program is printed, since the program can be electronically captured, for instance, via optical scanning of the paper or other medium, then compiled, interpreted or otherwise processed in a suitable manner if necessary, and then stored in a computer memory.

Those skilled in the art will appreciate that the present disclosure may be practiced in network computing environments with many types of computer system configurations, including in-dash vehicle computers, personal computers, desktop computers, laptop computers, message processors, handheld devices, multi-processor systems, microprocessor-based or programmable consumer electronics, network PCs, minicomputers, mainframe computers, mobile telephones, PDAs, tablets, pagers, routers, switches, various storage devices, and the like. The disclosure may also be practiced in distributed system environments where local and remote computer systems, which are linked (either by hardwired data links, wireless data links, or by any combination of hardwired and wireless data links) through a network, both perform tasks. In a distributed system environment, program modules may be located in both the local and remote memory storage devices.

Further, where appropriate, the functions described herein can be performed in one or more of hardware, software, firmware, digital components, or analog components. For example, one or more application specific integrated circuits (ASICs) can be programmed to carry out one or more of the systems and procedures described herein. Certain terms are used throughout the description, and claims refer to particular system components. As one skilled in the art will appreciate, components may be referred to by different names. This document does not intend to distinguish between components that differ in name, but not function.

At least some embodiments of the present disclosure have been directed to computer program products comprising such logic (e.g., in the form of software) stored on any computer-usable medium. Such software, when executed in one or more data processing devices, causes a device to operate as described herein.

While various embodiments of the present disclosure have been described above, it should be understood that they have been presented by way of example only, and not limitation. It will be apparent to persons skilled in the relevant art that various changes in form and detail can be made therein without departing from the spirit and scope of the present disclosure. Thus, the breadth and scope of the present disclosure should not be limited by any of the above-described example embodiments but should be defined only in accordance with the following claims and their equivalents. The foregoing description has been presented for the purposes of illustration and description. It is not intended to be exhaustive or to limit the present disclosure to the precise form disclosed. Many modifications and variations are possible in light of the above teaching. Further, it should be noted that any or all of the aforementioned alternate implementations may be used in any combination desired to form additional hybrid implementations of the present disclosure. For example, any of the functionality described with respect to a particular device or component may be performed by another device or component. Further, while specific device characteristics have been described, embodiments of the disclosure may relate to numerous other device characteristics. Further, although embodiments have been described in language specific to structural features and/or methodological acts, it is to be understood that the disclosure is not necessarily limited to the specific features or acts described. Rather, the specific features and acts are disclosed as illustrative forms of implementing the embodiments. Conditional language, such as, among others, "can," "could," "might," or "may," unless specifically stated otherwise, or otherwise understood within the context as used, is generally intended to convey that certain embodiments could include, while other embodiments may not include, certain features, elements, and/or steps. Thus, such conditional language is not generally intended to imply that features, elements, and/or steps are in any way required for one or more embodiments.

That which is claimed is:

1. A method comprising:
    determining, at a first instant in time, a first separation distance between a mobile device and a wearable device;
    determining, at a second instant in time, a second separation distance between the mobile device and the wearable device;
    evaluating the first separation distance and the second separation distance to determine a location of the mobile device relative to an individual, the location including at least one of: a front portion of the individual or a rear portion of the individual; and
    executing a wireless signal procedure to calculate a distance between the mobile device and a vehicle, wherein the calculating comprises compensating for a wireless signal attenuation that is attributable to the location of the mobile device relative to the individual.

2. The method of claim 1, wherein identifying the location comprises:
    detecting a swinging action of an arm of an individual; and
    detecting that the wearable device is worn on a wrist of the individual.

3. The method of claim 2, further comprising:
    transmitting, by the mobile device, to a processor in the vehicle, and based on determining that the mobile device is located in the rear portion of the individual, a signal advisory advising the processor to apply a compensating factor to a measurement performed by the processor to determine a separation distance between the individual and the vehicle.

4. The method of claim 2, wherein the first instant in time is selected to correspond to a peak-forward swing of the arm of the individual, and the second instant in time is selected to correspond to a peak-backward swing of the arm of the individual.

5. The method of claim 2, wherein determining the first separation distance and the second separation distance between the mobile device and the wearable device comprises using a wireless signal to execute a time-of-flight measurement between the mobile device and the wearable device.

6. The method of claim 5, wherein the wireless signal is an ultra-wideband (UWB) signal.

7. The method of claim 1, wherein executing the wireless signal procedure to calculate the distance between the mobile device and the vehicle is a received signal strength indication (RSSI) procedure, and wherein compensating for the wireless signal attenuation comprises adjusting an amplitude of a received signal strength indication in the mobile device based on a wireless signal attenuation characteristic of human body tissue.

8. A non-transitory computer-readable medium storing computer-executable instructions, that when executed by a processor, cause the processor to perform operations of:
   determining, at a first instant in time, a first separation distance between a mobile device and a wearable device;
   determining, at a second instant in time, a second separation distance between the mobile device and the wearable device;
   evaluating the first separation distance and the second separation distance to determine a location of the mobile device relative to an individual, the location including at least one of: a front portion of the individual or a rear portion of the individual; and
   executing a wireless signal procedure to calculate a distance between the mobile device and a vehicle, wherein calculating comprises compensating for a wireless signal attenuation that is attributable to the location of the mobile device.

9. The non-transitory computer-readable medium of claim 8, wherein the computer-executable instructions further cause the processor to perform operations of:
   determining that an intervening object is located between a mobile device and a vehicle, the determining comprising identifying a location of the mobile device based on an interaction between the mobile device and a wearable device, wherein the intervening object is a body part of an individual carrying the mobile device, an item of clothing worn by the individual, and/or an accessory in which the mobile device is carried by the individual.

10. The non-transitory computer-readable medium of claim 9, wherein the wireless signal procedure is an RSSI procedure, an angle-of-arrival (AoA), or angle-of-departure (AoD) procedure, and wherein the interaction between the mobile device and the wearable device is performed via UWB communications.

11. The non-transitory computer-readable medium of claim 8, wherein identifying the location comprises:
   detecting a swinging action of an arm of an individual; and
   detecting that the wearable device is worn on a wrist of the individual.

12. The non-transitory computer-readable medium of claim 11, wherein determining the first separation distance and the second separation distance between the mobile device and the wearable device comprises using a wireless signal to execute a time-of-flight measurement between the mobile device and the wearable device.

13. The non-transitory computer-readable medium of claim 12, wherein the wireless signal is an ultra-wideband (UWB) signal.

14. The non-transitory computer-readable medium of claim 11, wherein determining the first separation distance and the second separation distance between the mobile device and the wearable device comprises using a wireless signal to execute one of an angle-or-arrival procedure or a time-of-flight (ToF) trilateration procedure.

15. The non-transitory computer-readable medium of claim 11, wherein the computer-executable instructions further cause the processor to perform operations of:
   transmitting, by the mobile device, to a processor in the vehicle, and based in part on determining that the mobile device is located in the rear portion of the individual, a flag to indicate to the processor to apply a compensating factor to a measurement performed by the processor to determine a separation distance between the individual and the vehicle.

16. The non-transitory computer-readable medium of claim 15, wherein the computer-executable instructions further cause the processor to perform operations of:
   desisting from applying the compensating factor upon detecting non-receipt of the flag from the mobile device.

17. A system comprising:
   a mobile device configured to execute passive key hands-free operations;
   a passive key hands-free management system in a vehicle, the passive key hands-free management system comprising:
      a first memory that stores computer-executable instructions; and
      a first processor configured to access the first memory and execute the computer-executable instructions to at least:
         determine, at a first instant in time, a first separation distance between a mobile device and a wearable device;
         determine, at a second instant in time, a second separation distance between the mobile device and the wearable device;
         evaluate the first separation distance and the second separation distance to determine a location of the mobile device relative to an individual, the location including at least one of: a front portion of the individual or a rear portion of the individual; and
         apply a compensating factor to an amplitude of a first wireless signal, the compensating factor based on a wireless signal attenuation characteristic attributable to the location of the mobile device relative to the individual.

18. The system of claim 17, further comprising a wearable device, and wherein the mobile device comprises:
   a second memory that stores computer-executable instructions; and
   a second processor configured to access the second memory and execute the computer-executable instructions to at least:
      detect a swinging action of an arm of the individual carrying the mobile device;
      determine, at a first instant in time, a first separation distance between the mobile device and the wearable device that is worn on the arm of the individual;
      determine, at a second instant in time, a second separation distance between the mobile device and the wearable device; and evaluate the first separation distance and the second separation distance to determine that the mobile device is one of located in a front portion of the individual or a rear portion of the individual;

determine that the individual is moving towards the vehicle; and transmit, to the first processor in the vehicle, the first wireless signal upon determining that the mobile device is located in the rear portion of the individual.

19. The system of claim 18, wherein determining the first separation distance and the second separation distance between the mobile device and the wearable device comprises using a second wireless signal to execute a time-of-flight measurement between the mobile device and the wearable device.

20. The system of claim 19, wherein the first wireless signal is an ultra-wideband (UWB) signal, wherein the wearable device is one of a smartwatch or a fitness bracelet, and the mobile device is one of a cellular phone, a tablet computer, or a phablet.

\* \* \* \* \*